US009252626B2

(12) United States Patent
Coe et al.

(10) Patent No.: US 9,252,626 B2
(45) Date of Patent: Feb. 2, 2016

(54) BATTERY POWER TRANSFER SYSTEM

(71) Applicant: Younicos, Inc., Kyle, TX (US)

(72) Inventors: Carlos Coe, San Marcos, TX (US);
Aeron Hurst, Martindale, TX (US)

(73) Assignee: YOUNICOS, INC., Kyle, TX (US)

( * ) Notice: Subject to any disclaimer, the term of this patent is extended or adjusted under 35 U.S.C. 154(b) by 0 days.

(21) Appl. No.: 14/482,889

(22) Filed: Sep. 10, 2014

(65) Prior Publication Data
US 2014/0375270 A1 Dec. 25, 2014

Related U.S. Application Data

(62) Division of application No. 12/702,874, filed on Feb. 9, 2010, now Pat. No. 8,847,551.

(60) Provisional application No. 61/151,002, filed on Feb. 9, 2009.

(51) Int. Cl.
| H02J 7/00 | (2006.01) |
| H02J 7/14 | (2006.01) |
| H02J 1/00 | (2006.01) |
| H01M 10/44 | (2006.01) |
| G01R 31/36 | (2006.01) |
| H01M 10/48 | (2006.01) |

(52) U.S. Cl.
CPC ............... *H02J 7/007* (2013.01); *H01M 10/44* (2013.01); *H02J 1/00* (2013.01); *H02J 7/0021* (2013.01); *H02J 7/0063* (2013.01); *G01R 31/3662* (2013.01); *H01M 10/48* (2013.01); *Y02E 60/12* (2013.01)

(58) Field of Classification Search
USPC ......... 320/127, 134, 128, 136, 125, 137, 124, 320/132, 130, 131; 324/426, 427, 428, 430
See application file for complete search history.

(56) References Cited

U.S. PATENT DOCUMENTS

| 5,274,571 | A | 12/1993 | Hesse et al. |
| 5,369,353 | A | 11/1994 | Erdman |
| 5,545,969 | A * | 8/1996 | Hasegawa .......... G01R 31/3624 320/134 |
| 5,563,802 | A | 10/1996 | Plahn et al. |
| 5,710,501 | A | 1/1998 | Van Phuoc et al. |
| 6,337,560 | B1 * | 1/2002 | Kalogeropoulos ... H02J 7/0073 320/125 |
| 6,522,031 | B2 | 2/2003 | Provanzana et al. |
| 6,580,977 | B2 | 6/2003 | Ding et al. |
| 6,674,265 | B2 | 1/2004 | Yoshida et al. |
| 6,747,370 | B2 | 6/2004 | Abe |
| 6,858,953 | B2 | 2/2005 | Stahlkopf |
| 6,900,556 | B2 | 5/2005 | Provanzana et al. |

(Continued)

FOREIGN PATENT DOCUMENTS

WO WO 2009/136975 11/2009
WO WO 2013/068149 A2 5/2013

*Primary Examiner* — Edward Tso
*Assistant Examiner* — Alexis A Boateng
(74) *Attorney, Agent, or Firm* — Foley & Lardner LLP

(57) ABSTRACT

A battery power transfer system includes control circuitry coupled to a charge/discharge module. The charge/discharge module is configured to apply an electrical stimulus to a battery and to determine, based at least in part on a measured response of the battery to the applied electrical stimulus, a target power transfer frequency of the battery. The power is transferred to or from the battery with a power transfer profile comprising current pulses having a frequency component selected based on the determined target power transfer frequency.

30 Claims, 16 Drawing Sheets

(56) References Cited

U.S. PATENT DOCUMENTS

| | | | |
|---|---|---|---|
| 7,002,260 B2 | 2/2006 | Stahlkopf | |
| 7,227,275 B2 | 6/2007 | Hennessy et al. | |
| 7,265,456 B2 | 9/2007 | Hennessy | |
| 7,298,059 B2 | 11/2007 | Delmerico et al. | |
| 7,353,083 B2 | 4/2008 | Hennessy | |
| 7,432,611 B2 | 10/2008 | Stahlkopf | |
| 7,613,548 B2 | 11/2009 | Cardinal et al. | |
| 7,622,816 B2 | 11/2009 | Stahlkopf | |
| 7,679,215 B2 | 3/2010 | Delmerico et al. | |
| 7,826,908 B2 | 11/2010 | Cheng et al. | |
| 7,890,217 B2 | 2/2011 | Cardinal et al. | |
| 7,908,036 B2 | 3/2011 | Kirchner et al. | |
| 7,941,246 B2 | 5/2011 | Miller et al. | |
| 7,952,232 B2 | 5/2011 | Burra et al. | |
| 8,159,186 B2 | 4/2012 | Iida et al. | |
| 8,159,188 B2 | 4/2012 | Anderson | |
| 8,185,249 B2 | 5/2012 | Kirchner et al. | |
| 8,222,765 B2 | 7/2012 | Collins et al. | |
| 8,237,301 B2 | 8/2012 | Delmerico et al. | |
| 8,277,964 B2 | 10/2012 | Hennessy | |
| 8,301,311 B2 | 10/2012 | Nelson | |
| 8,335,547 B2 | 12/2012 | Otterson | |
| 8,338,987 B2 | 12/2012 | O'Brien et al. | |
| 8,344,550 B2 | 1/2013 | Delmerico et al. | |
| 8,373,312 B2 | 2/2013 | O'Brien et al. | |
| 8,400,112 B2 | 3/2013 | Anderson | |
| 8,452,461 B2 | 5/2013 | Sawyer et al. | |
| 8,471,406 B2 | 6/2013 | Patel et al. | |
| 8,532,834 B2 | 9/2013 | Delong et al. | |
| 2001/0028238 A1* | 10/2001 | Nakamura | G01R 31/3662 320/132 |
| 2003/0062875 A1* | 4/2003 | Nakamura | G01R 31/3662 320/132 |
| 2004/0104706 A1* | 6/2004 | Ooi | G01R 31/3613 320/132 |
| 2005/0068008 A1* | 3/2005 | Zhang | H02J 7/0026 320/134 |
| 2008/0224541 A1 | 9/2008 | Fukuhara | |
| 2009/0184835 A1 | 7/2009 | Deaver et al. | |
| 2010/0019726 A1* | 1/2010 | Kumar | B60L 3/0046 320/125 |
| 2010/0057267 A1 | 3/2010 | Liu et al. | |
| 2010/0145533 A1 | 6/2010 | Cardinal et al. | |
| 2010/0201320 A1* | 8/2010 | Coe | H01M 10/44 320/129 |
| 2011/0001318 A1 | 1/2011 | Nelson | |
| 2011/0187106 A1 | 8/2011 | Ichinose et al. | |
| 2011/0221276 A1 | 9/2011 | Geinzer et al. | |
| 2012/0056588 A1 | 3/2012 | Cai et al. | |
| 2012/0248873 A1 | 10/2012 | Oudalov et al. | |
| 2013/0249215 A1 | 9/2013 | Egedal et al. | |
| 2013/0257351 A1 | 10/2013 | Yasuyuki et al. | |
| 2013/0278203 A1 | 10/2013 | Coe et al. | |

* cited by examiner

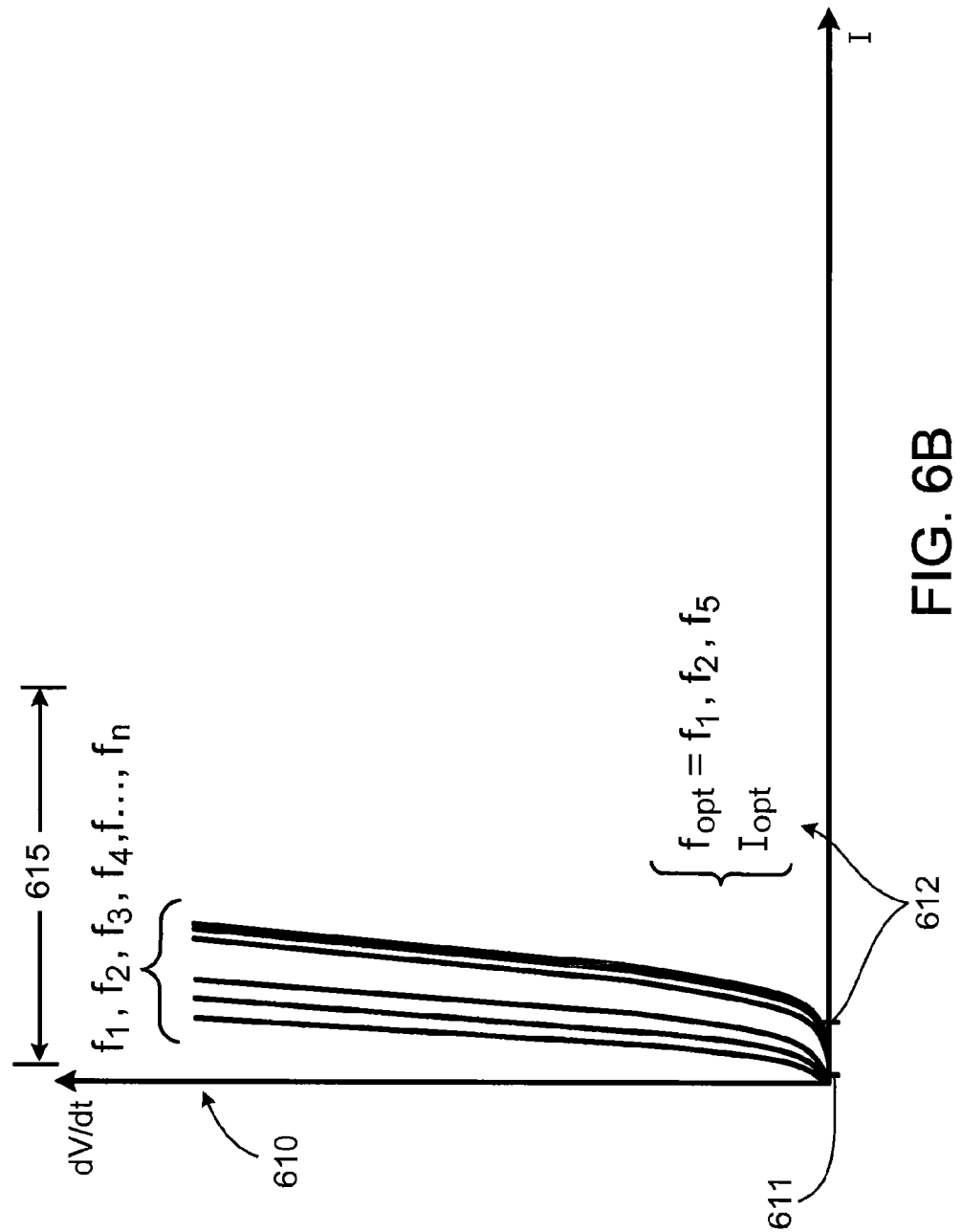

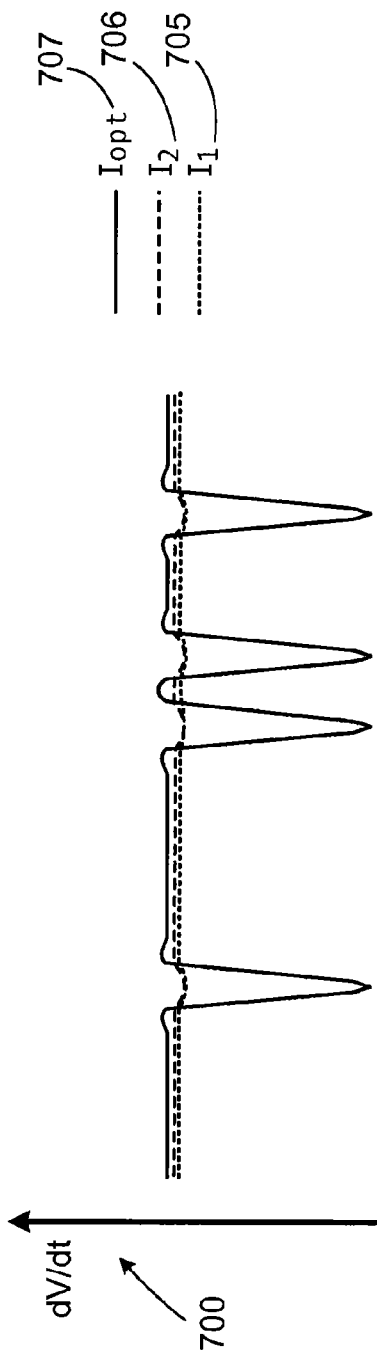
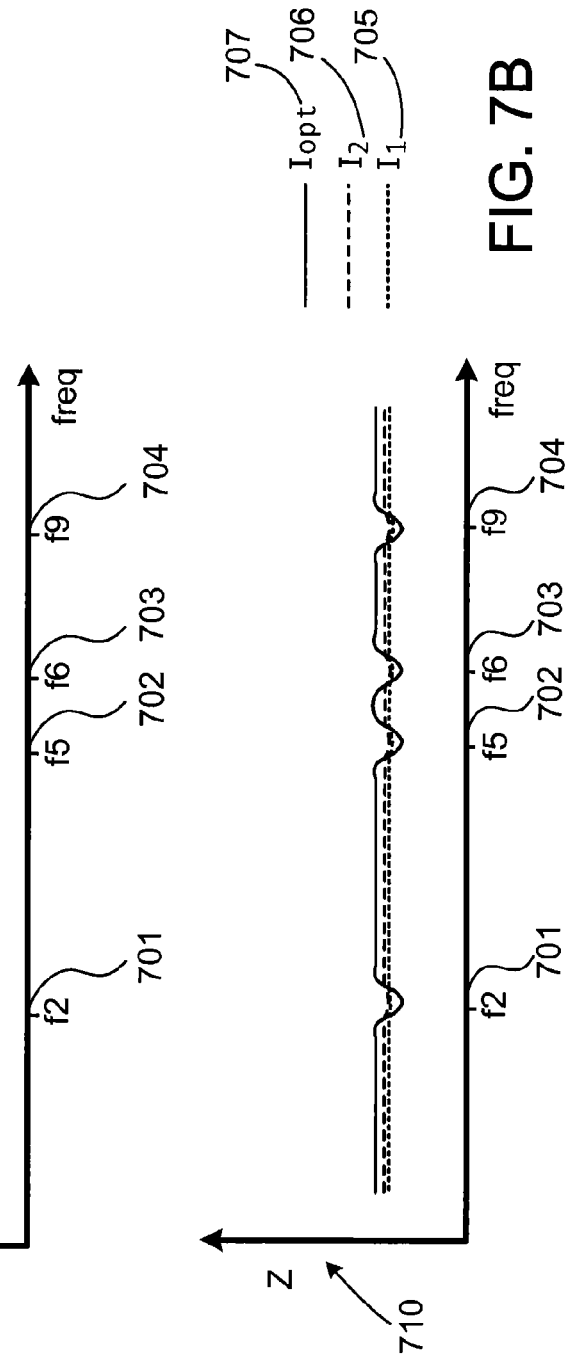

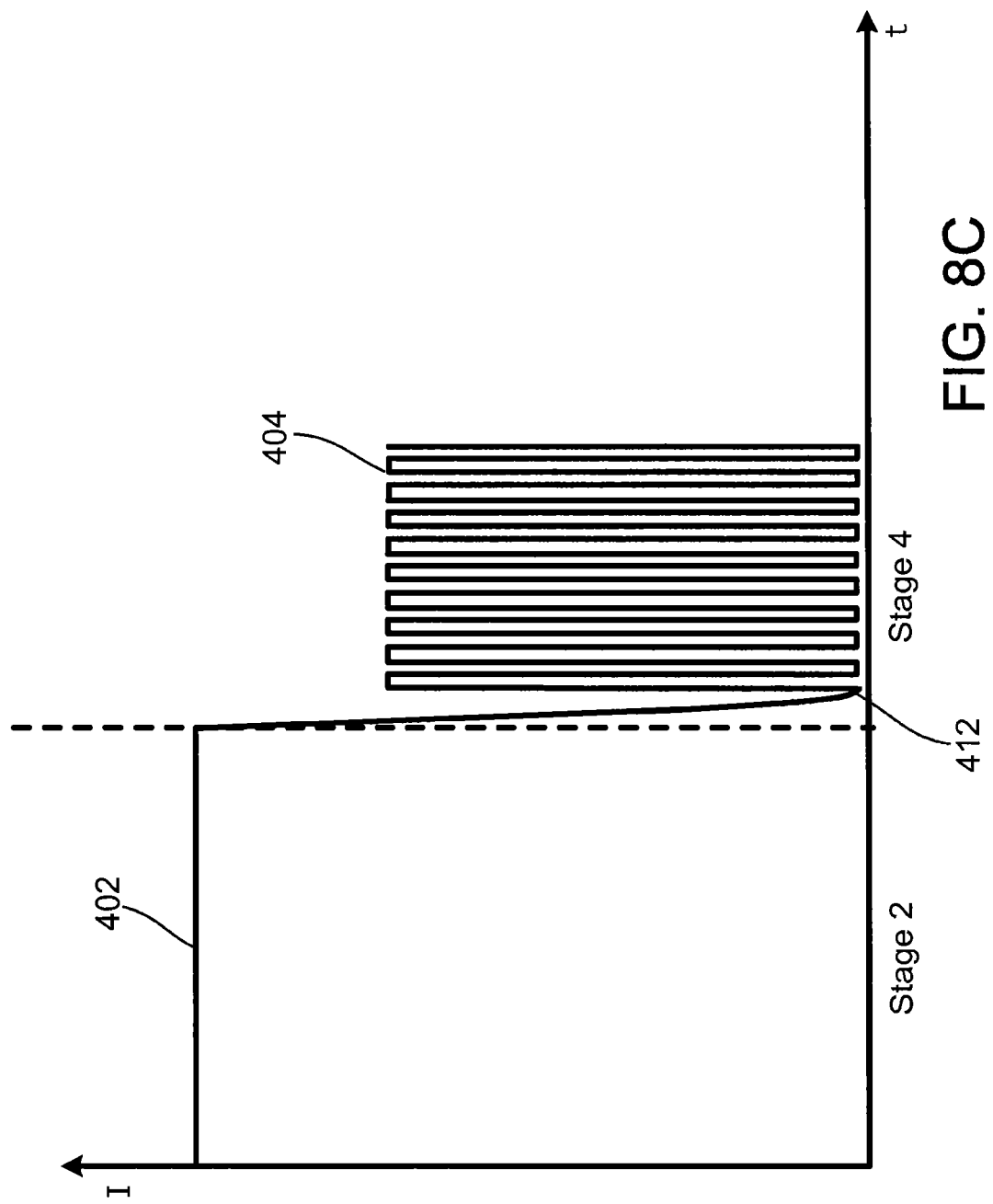

BATTERY POWER TRANSFER SYSTEM

CROSS-REFERENCE TO RELATED PATENT APPLICATIONS

This application is a Divisional of U.S. patent application Ser. No. 12/702,874, filed on Feb. 9, 2010, which claims the benefit of and priority to U.S. Provisional Patent Application No. 61/151,002, filed Feb. 9, 2009. The entire disclosures of U.S. patent application Ser. No. 12/702,874 and U.S. Provisional Patent Application No. 61/151,002 are incorporated herein by reference.

BACKGROUND

This invention relates to charging and discharging batteries and battery packs, such as packs consisting of multiple batteries or battery cells interconnected in series and/or parallel configuration by electrical conductors, to be charged or discharged.

D.C. electrical storage devices, such as lead acid or lithium ion batteries, are able to store and release energy for use in a variety of applications including electric vehicles, portable power supplies, and alternative energy power systems. When using batteries to store energy, it is desirable to be able to charge and discharge the batteries as efficiently, and as quickly, as possible. However, discharging a battery too quickly can reduce its capacity in Amp-Hours and can also lead to high internal temperatures. Further, discharging some batteries below a minimum state of charge ("SOC") can result in permanent damage and/or shortened battery life. Even when a battery is discharged at the battery's natural rate, the dynamic internal impedance of the battery can generate losses in the form of heat. This results in lower discharge efficiencies.

Improvements in the energy conversion rate and the discharge efficiency of batteries would provide significant benefits to many industries, particularly if the improvements provide for increased specific power, faster discharge, and/or increased battery life.

SUMMARY

In one embodiment, this application relates to a battery power transfer system. The battery power transfer system includes control circuitry coupled to a charge/discharge module. The charge/discharge module is configured to apply an electrical stimulus to a battery and to determine, based at least in part on a measured response of the battery to the applied electrical stimulus, a target power transfer frequency of the battery. The power is transferred to or from the battery with a power transfer profile comprising current pulses having a frequency component selected based on the determined target power transfer frequency.

In another embodiment, this application relates to a battery power transfer system. The battery power transfer system includes control circuitry coupled to a charge/discharge module. The charge/discharge module is configured to apply an electrical stimulus to a battery and to determine a target power transfer frequency of the battery. The power is transferred to or from the battery with a power transfer profile comprising current pulses having a frequency component selected based on the determined target power transfer frequency.

In yet another embodiment, this application relates to a method of charging a battery. The method includes applying an electrical stimulus to the battery using a charge/discharge module; measuring a response of the battery to the electrical stimulus using the charge/discharge module; determining a target power transfer frequency based at least in part on the response of the battery to the applied electrical stimulus; and charging the battery with a charge current profile comprising current pulses having a frequency component selected based on the determined target power transfer frequency.

In various aspects, a discharge current profile comprising current pulses having a frequency component selected based on a determined target frequency may be applied to one or more batteries to improve the discharge efficiency of the battery. In one aspect, discharging a battery is accomplished by: applying an electrical stimulus to the battery; measuring a response to the electrical stimulus, the measured response providing an indication of discharge efficiency of the battery; determining a target frequency corresponding to a maximum discharge efficiency; and then discharging the battery with a discharge current profile including current pulses having a frequency component selected based on the determined resonant discharge frequency. In some implementations, the frequency component is the determined target frequency, or a harmonic thereof. In some examples, the electrical stimulus is a transient signal, or a random signal having a flat power spectral density within a fixed bandwidth at a predetermined center frequency. In some implementations, the electrical stimulus is a discharge pulse signal having a discharge pulse frequency, and applying the electrical stimulus to the battery includes sweeping the discharge pulse frequency over a frequency sweep range from an initial pulse frequency to a maximum pulse frequency. In some implementations, the measured response of the battery is a rate of change in voltage, a dynamic internal impedance, or a frequency response. Further, the discharge profile in some implementations includes a base current having a base current magnitude such that the current pulses are superimposed on the base current. The base current magnitude is dependent on the measured response in some examples and some examples include adjusting the base current magnitude based on the measured response.

In some examples, measuring the response includes: measuring a change in voltage of the battery over a predetermined period of time while the discharge pulse frequency is swept over the frequency sweep range; and calculating, based on the measured change in voltage, a rate of change in voltage. In some examples, measuring the response includes measuring a voltage across the terminals of the battery, measuring a current flowing through the battery, and calculating, based in part on the measured voltage and current, an internal dynamic impedance of the battery, such that the voltage and the current are measured while the discharge pulse frequency is swept over the frequency sweep range. The battery, in some implementations, is one of several interconnected batteries of a battery pack. Further, in some implementations, the current pulses include different frequency components selected based on determined target frequencies of different batteries of the pack.

In another aspect, a battery power transfer system includes: control circuitry coupled to a charge/discharge module, the control circuitry configured to cause the charge/discharge module to apply a stimulus to the battery and to determine, based at least in part on a measured response of the battery to the applied stimulus, a target power transfer frequency of the battery, such that power is transferred from the battery with a power transfer profile including current pulses having a frequency component selected based on the determined target power transfer frequency. In some implementations, the frequency component is the determined target power transfer frequency, or a harmonic thereof. The charge/discharge module in some implementations is a bidirectional power supply. In some implementations, the battery power transfer system also includes measurement circuitry coupled with the control circuitry to provide the measured response of the battery. The measurement circuitry may include, for example, an optically-isolated voltage detector, one or more current sensors, e.g. a shunt or a hall effect sensors, frequency detection circuitry, and/or a spectrum analyzer. In some implementations, the measured response is a rate of change in voltage, a dynamic internal impedance, and/or a frequency response.

In some implementations, the electrical stimulus includes, for example, a transient signal and/or a random signal having a flat power spectral density within a fixed bandwidth at a predetermined center frequency. In some implementations, the electrical stimulus is a pulse signal having a pulse frequency, and the charge/discharge module sweeps the pulse frequency over a frequency sweep range from an initial pulse frequency to a maximum pulse frequency. Further, the power transfer profile in some implementations includes a base current having a base current magnitude such that the current pulses are superimposed on the base current. The base current magnitude is dependent on the measured response in some examples and some examples include adjusting the base current magnitude based on the measured response. The battery, in some implementations, is one of several interconnected batteries of a battery pack. Further, in some implementations, the current pulses include different frequency components selected based on determined target power transfer frequencies of different batteries of the pack.

Application of the teachings described herein may provide significant benefits to many industries, including the hybrid vehicle industry, the alternative energy industry, and the power distribution industry. For example, increased specific power may result in smaller battery packs for hybrid vehicles and/or increased mileage. In large scale power systems, battery packs having increased specific power and/or more efficient discharge cycles may provide a more cost effective solution in load leveling, power regulation, and power smoothing applications through improved system performance and increased battery life. More generally, extended battery life and improved discharge efficiencies may result in reduced environmental waste and greater energy conservation, respectively.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 6B is a graph plot showing dV/dt versus I at multiple pulse frequencies for batteries having an SOC of 80-85 percent.

FIG. 7A is a graph plot showing dV/dt versus frequency at multiple charge current levels.

FIG. 7B is a graph plot showing a dynamic internal impedance of the battery pack versus frequency at multiple charge current levels.

FIGS. 8A-8C illustrate additional examples of multi-stage charging algorithms.

Like reference symbols in the various drawings indicate like elements.

DETAILED DESCRIPTION

Figure 1:
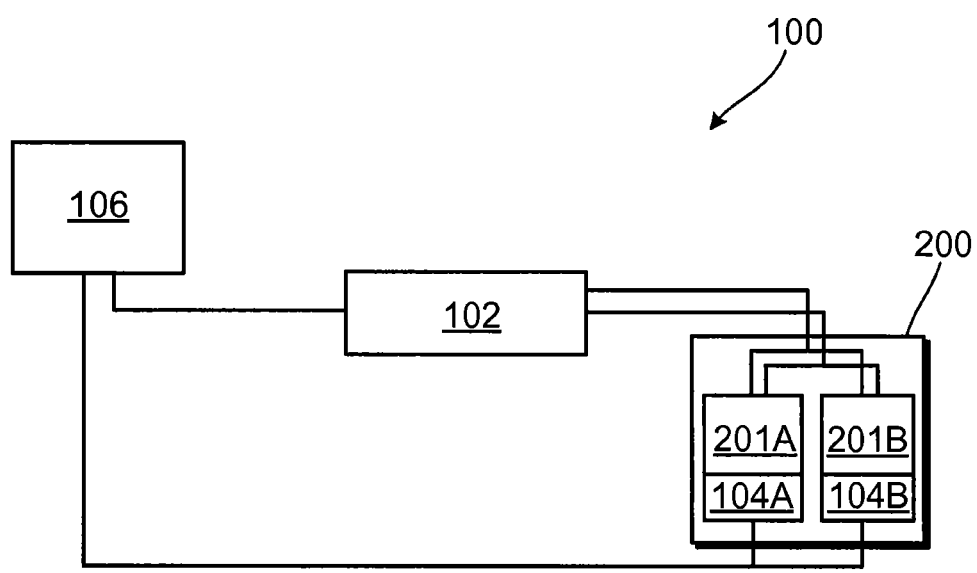
FIG. 1 illustrates a battery pack and a charge/discharge system.

FIG. 1 shows an example of a charge/discharge system 100 including a charge/discharge module 102, a sensor module 104A, 104B, and a control module 106, and connected to a battery pack 200. Although the illustrated battery pack 200 includes two batteries 201A, 201B, connected in parallel, the system 100 may be connected to a single battery or multiple batteries connected in series, in parallel, or some combination thereof. The batteries 211B, 221B may be of a common type, including, for example, sealed lead acid batteries, Ni-Cad, NiMH, Li-Polymer, or Li-Ion, or any other suitable battery depending on the desired applications, operating environments, and costs. Further, the batteries 211B, 221B may be single-cell or multi-cell batteries. For example, in one instance, a sealed lead acid battery 211B, 221B may include a single 1.5 volt cell; in other instances, the battery may include a combination of multiple cells, such as eight 1.5 volt cells connected in series to provide 12 volts at the battery terminals. The batteries 211B, 221B are preferably of similar construction to ensure they have similar electrical characteristics. For example, the batteries may use the same chemistry, have the same dimensions, etc. Preferably, the batteries 211B, 221B also have the lowest series impedance possible for the chemistry used, with some preferred examples of the lead-acid batteries employed having an open circuit series impedance of 5-10 milli-ohms or less. In some implementations, the batteries 211B, 221B are selected to have similar charge acceptance characteristics, discharge rate characteristics and under-load impedances. For instance, the selected batteries may provide similar currents at a similar voltage when an identical load is applied across their positive and negative terminals.

Figure 2:
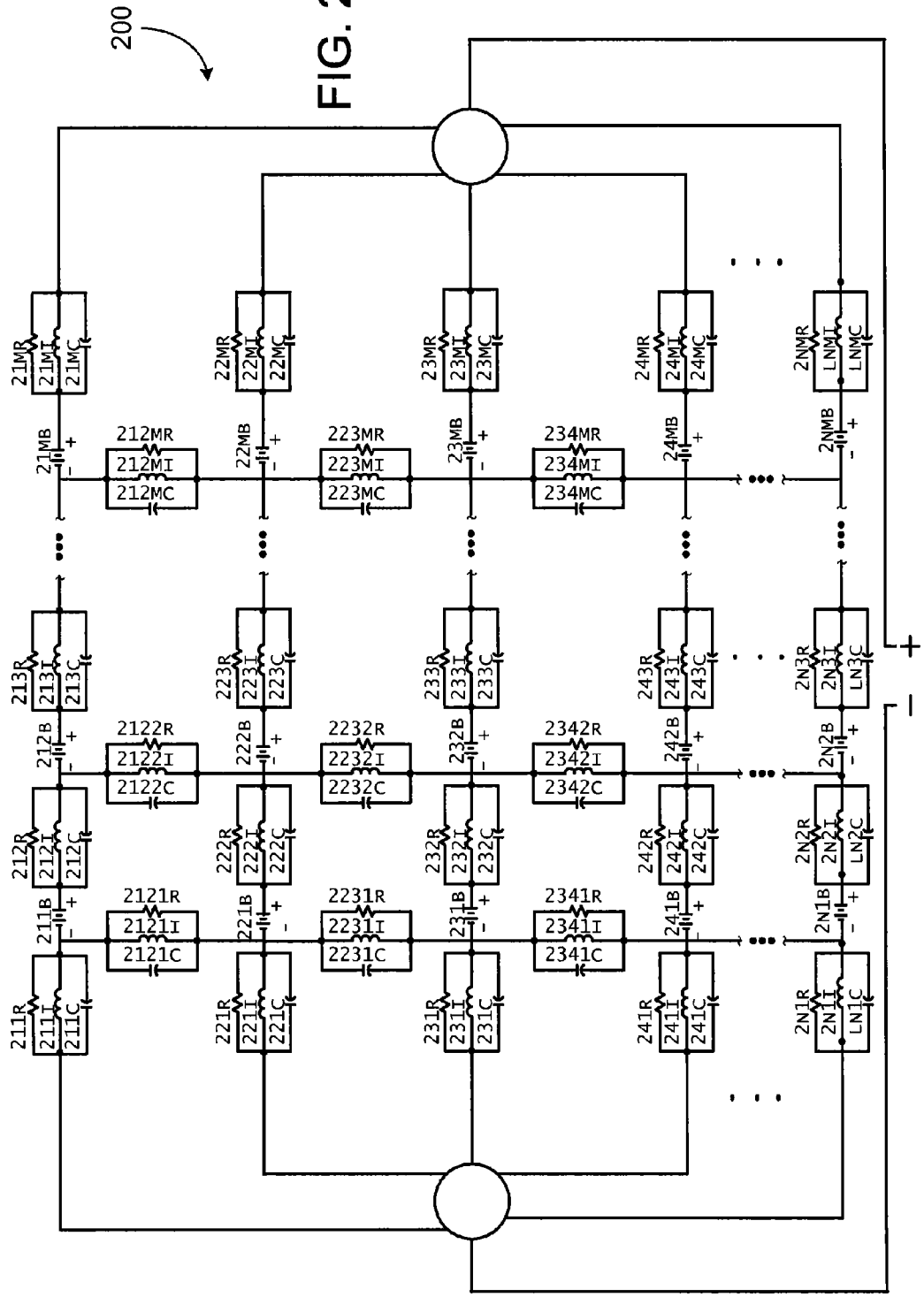
FIG. 2 is a schematic representation of a battery pack.

FIG. 2 is a generalized circuit diagram of a battery pack 200 according to another implementation. Reference numbers associated with elements of the array depicted in the FIG. 2 indicate the type of the element and its position within the array. For most of the reference numbers in FIG. 2, the first digit of the reference number indicates the figure number, the second digit indicates a row position, and the third digit indicates a column position with "N" and "M" corresponding to the final row or column in an array with N rows and M columns of batteries. Reference numbers ending with an "R" refer to the equivalent resistance of a conductor, reference numbers ending with an "I" refer to the equivalent inductance of a conductor, reference numbers ending with a "C" refer to the equivalent capacitance of a conductor, and reference numbers ending with a "B" refer to a battery. The depicted conductors in FIG. 2 are each represented by a resistor, inductor and capacitor such as 211R, 211I, and 211C.

In general, battery pack 200 includes an array of batteries 211B-2NMB connected with cables, busbars, and/or any other suitable conductor. In some implementations, the conductors are precision matched conductors having electrical lengths matched to that of similarly positioned conductors within the array. For example, conductors 311, 312, 313, . . . , 31N may have matching electrical lengths. Similarly, conductors represented by 212R/212I/212C, 222R/222I/222C, 232R/232I/232C, 242R/242I/242C, . . . , and 2N2R/2N2I/

2N2C may have matching electrical lengths. In some implementations, connections are made using precision cabling to provide a uniform DC environment. For example, U.S. patent application Ser. No. 11/549,013, incorporated herein by reference, describes batteries connected in parallel via respective and distinct conductive paths, each conductive path having an under-load resistance differing from an under-load resistance of each other path by less than about 1 milli-ohm.

The battery pack 200 may have batteries connected in series, parallel, or some combination thereof by conductors. For example, a set of batteries may be connected in series by connecting the positive terminal of one battery to the negative terminal of another battery. The output voltage of a series circuit is equal to the sum the voltages of the batteries that are in series. For instance, the first row of the circuit diagram for battery pack 200 may consist of batteries 211B, 212B, . . . 21MB, and the voltage across the series is equal to the sum of the voltages of batteries 211B, 212B, . . . 21MB. Alternatively, the set of batteries may be connected in parallel by connecting the positive terminals of the batteries together, and the negative terminals of the batteries together, e.g., 211B, 221B, 231B, 241B, . . . 2N1B. The current capacity of the battery pack 200 increases with the number of parallel branches. For example, the current capacity of this portion of the circuit is equal to the sum of the currents capacity of the batteries 211B, 221B, 231B, 241B, . . . 2N1B.

Thus, the current capacity of the battery pack 200 can be increased or decreased by increasing or decreasing N, respectively, i.e. the number of rows in the array. Further, the terminal voltage of the battery pack 200 can be increase or decreased by increasing or decreasing M, respectively, i.e. the number of columns in the array. Therefore, depending on the desired applications, operating environments, and costs, the battery pack 200 may include any size M×N matrix where M is greater than or equal to 1 and N is greater than or equal to 1.

FIG. 1 also shows a charge/discharge module 102 coupled to the battery pack 200 and a control module 106. Although the charge/discharge module 102 is illustrated as one module, two or more separate modules may be used to provide one or more of the functions described herein. The charge/discharge module 102 includes a bidirectional programmable D.C. power supply, and a bidirectional programmable current generator/driver. The charge/discharge module 102 is capable of generating charge profiles having simple and complex current waveforms superimposed on a variable base current. For example, the current waveform may include multiple frequency components. Further, generated pulse shapes include square, triangular, sawtooth, sinusoidal, etc. The charge/discharge module is also capable of generating a discharge profile having simple and complex current waveforms superimposed on a variable D.C. load profile by reversing the current flow, for example. The power output, frequency range, and accuracy of the power supply and pulse current generator depends on the battery type and the size of the battery pack array. In some implementations, the constant current source and pulsed current generator are each capable of generating up to 100 A with an accuracy tolerance of 1.0 percent or better. Further, in some implementations, the pulsed current generator is capable of generating pulse currents having a frequency from 0 to 10 kHz.

A control module 106 is coupled to both the charge/discharge module 102 and the sensor module 104A, 104B. The control module 106 provides control signals to the charge/discharge module 102 and receives data signals from the sensor module 104A, 104B which are processed and recorded by the control module 106. This data is then used to modify the control signals sent to the charge/discharge module in order to effect a desired charge/discharge profile at the battery pack terminals. In some implementations, the control module 106 provides IEEE-488, RS485, RS232, RS422, and/or RS423 control signals to the charge/discharge module to produce the desired charge/discharge profile. Other communications protocols may also be used depending on the features and capabilities of the charge/discharge module 102 and the control module 106. In some implementations, the control module 106 includes an embedded microcontroller for directly interfacing with the power control circuits within the charge/discharge module 102.

The sensor module 104A, 104B includes at least one optically isolated voltage sensor which senses the voltage across each set of batteries connected in parallel. For example, in some implementations, an M×N array of batteries would include M voltage sensors, each connected in parallel with a respective battery 211B, 212B, . . . , and 21MB. The sensor module 104A, 104B also includes one or more current sensors, e.g. a shunt or a hall effect sensors, to sense the current flowing through each battery in the battery pack 200. Some implementations may include a spectrum analyzer or frequency detection circuitry to measure or detect a frequency response of the battery pack.

The sensor module 104A, 104B may have a measurement tolerance of 1.0 percent of full scale for each of the respective characteristics measured. In some implementations, the current sensors have a frequency response from 0 to 50 kHz and a measurement tolerance of 0.1 percent. In some implementations, the voltage sensors are optically isolated having a frequency response from 0 to 50 kHz, and a measurement tolerance of 0.1 percent. In some implementations, the sensor module 104A, 104B may also include temperature and/or pressure sensors to monitor the temperature and external or internal pressure of each battery, respectively. The sensed temperature and/or pressure measurements may then be provided to the control module 106 to modify the control signals sent to the charge/discharge module 102.

The charge/discharge system 100 may be used to maximize power transfer efficiency during charge and/or discharge cycles. The charge/discharge system 100 may be used to maximize the charge efficiency of the battery pack 200 by applying a charging profile that optimizes charge acceptance, e.g., by applying a profile including a pulse charge at the resonant charge frequency. The charge/discharge system 100 may also be used to maximize the discharge efficiency of the battery pack 200 by applying a discharge profile that optimizes charge release while minimizing or avoiding any damage to the battery pack 200, e.g., by applying a profile including a pulse discharge at the resonant discharge frequency. In some implementations, the charge/discharge system 100 may be used to avoid damage to the battery pack 200 resulting from over-voltage conditions and gassing during charging and/or voltage sag conditions during discharge. Although the resonant charge frequency and resonant discharge frequency can both be referred to as the resonant power transfer frequency of the battery pack, they are typically not the same frequency. In addition, there may be multiple frequencies that make up the resonant charge and discharge frequencies and these frequencies typically change based on environmental conditions and conditions within the battery, such as age, sulfation, state of charge/discharge, etc. Therefore, any reference to a "frequency" below may include one or more simultaneous frequency values, and may not refer to a constant value.

Figure 3A:
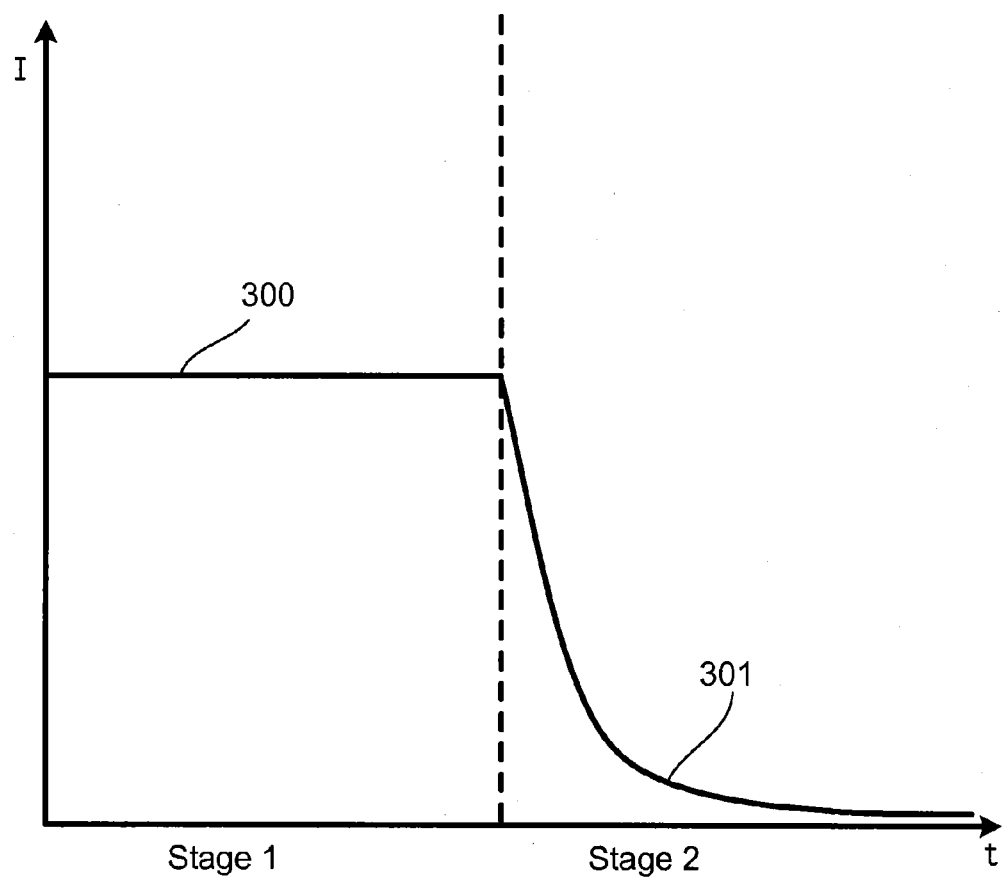
FIGS. 3A-3B illustrate a typical two-stage charging algorithm.
Figure 3B:
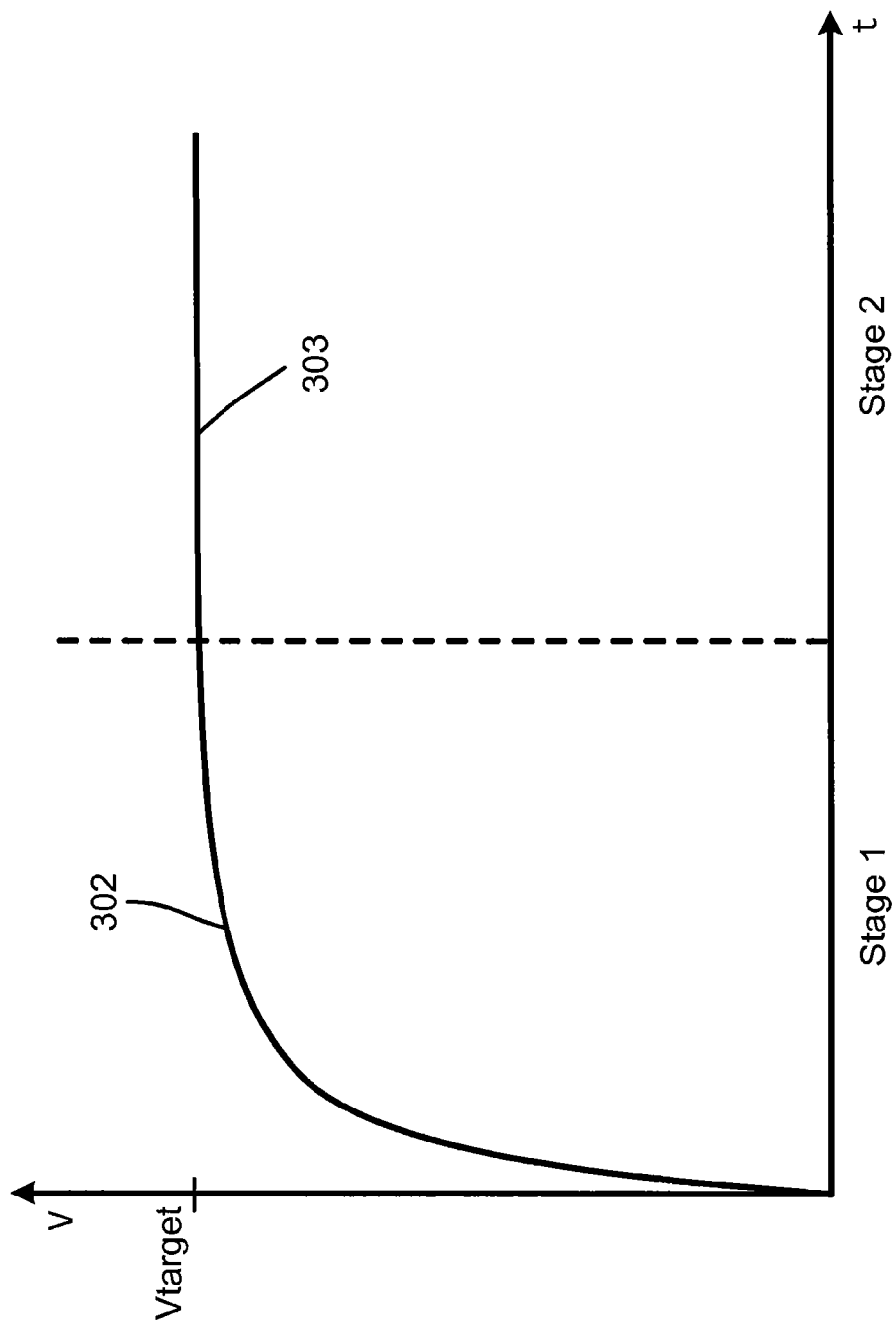
Figure 4A:
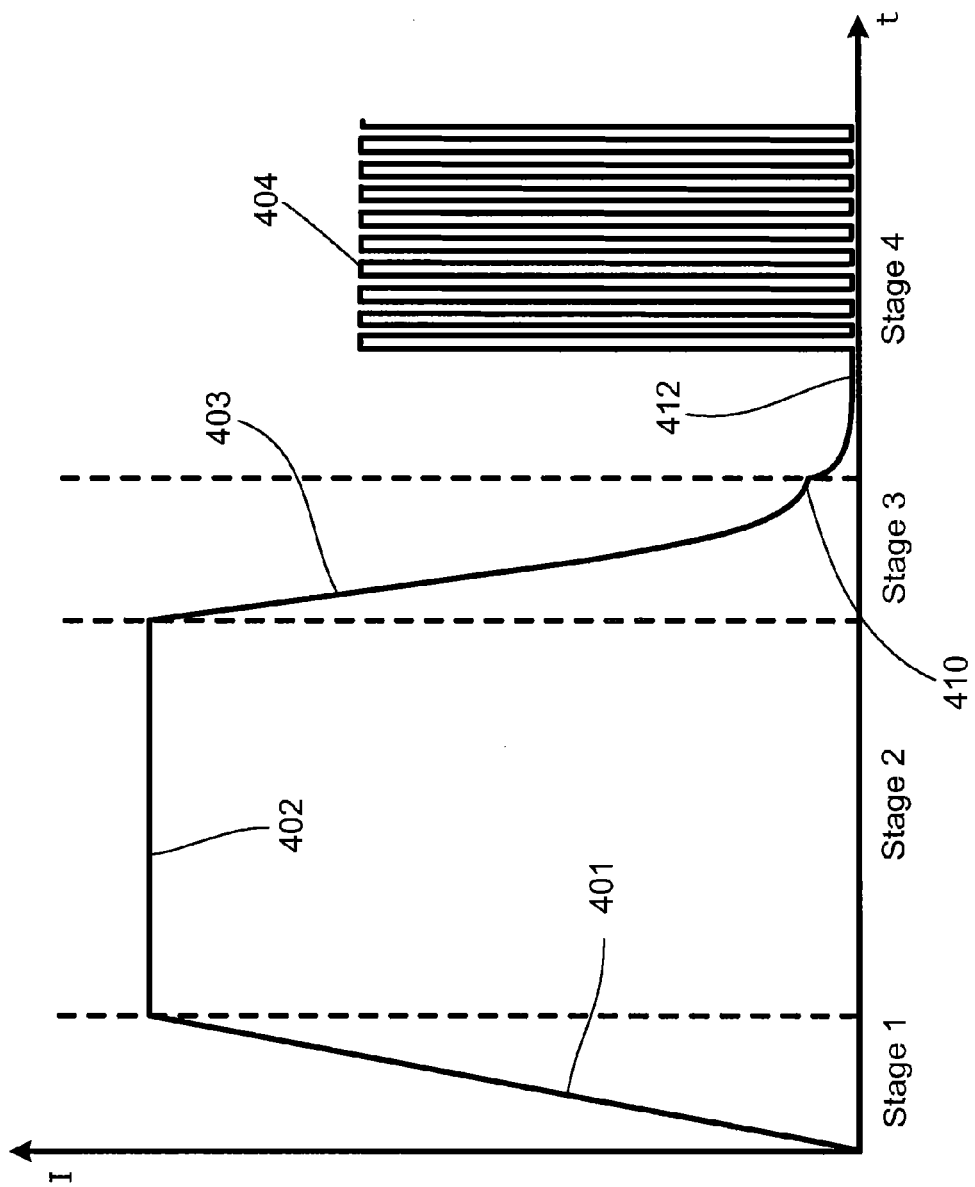
FIGS. 4A-5D illustrate examples of multi-stage charging algorithms.
Figure 4B:
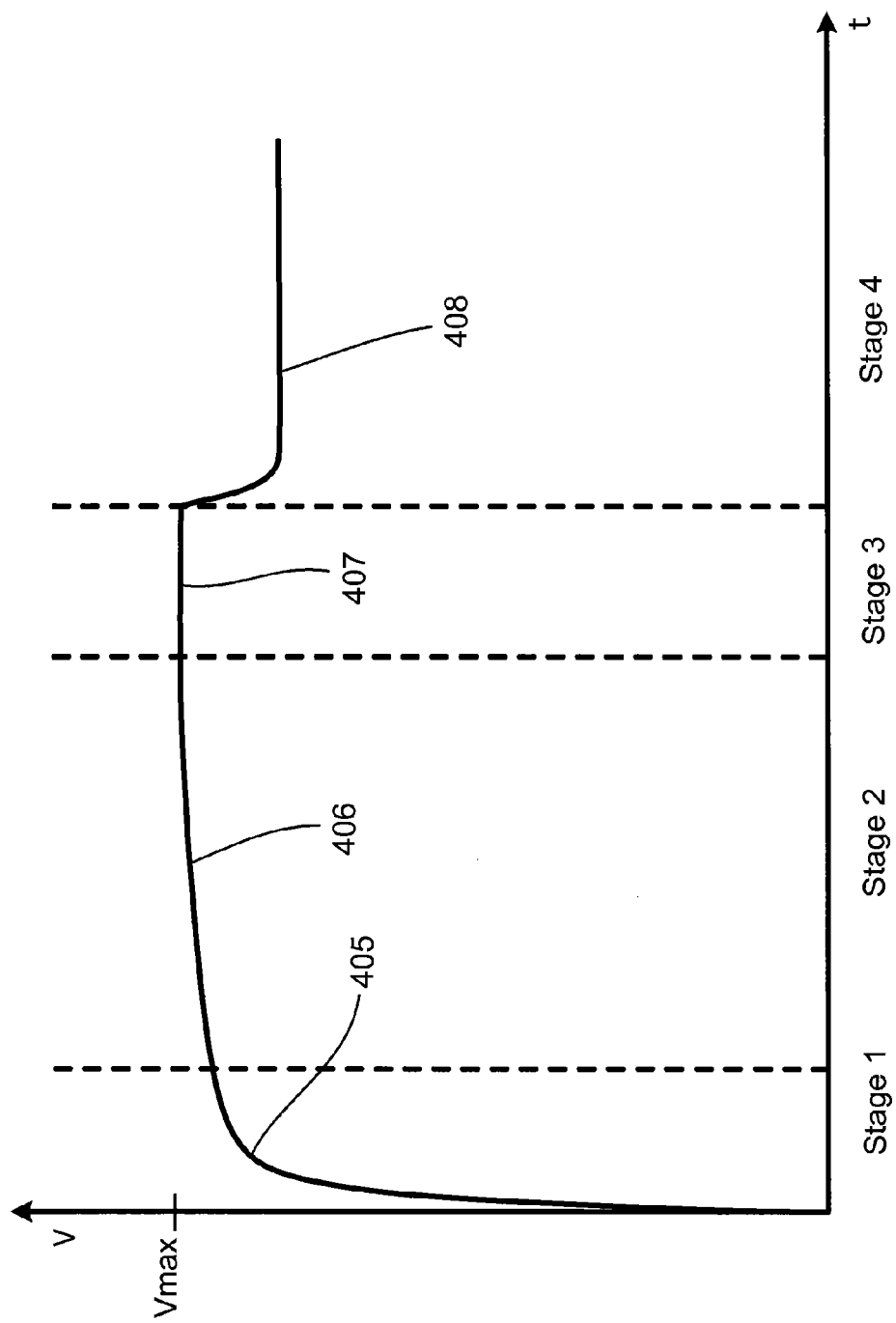

FIGS. 3A and 3B illustrate a typical two-stage charging profile for lead acid batteries. During stage one, a constant current 300 is applied to the battery pack 200 until the cell voltage reaches a preset target voltage. The preset voltage is typically set to correspond to a 70 percent state of charge (SOC). During stage two, a constant voltage is 303 applied to the battery pack 200 allowing the cells to absorb current at a slower rate until they reach saturation. Stage two typically takes an equal or greater amount of time in comparison to stage one, but is considered essential to maintaining the cells' ability to accept a full charge. Stage two is complete when the amount of current drawn 301 by the battery pack has leveled off or has dropped off to approximately 2-3 percent of the rated current at a 1C charge/discharge rate or less.

Figure 5A:
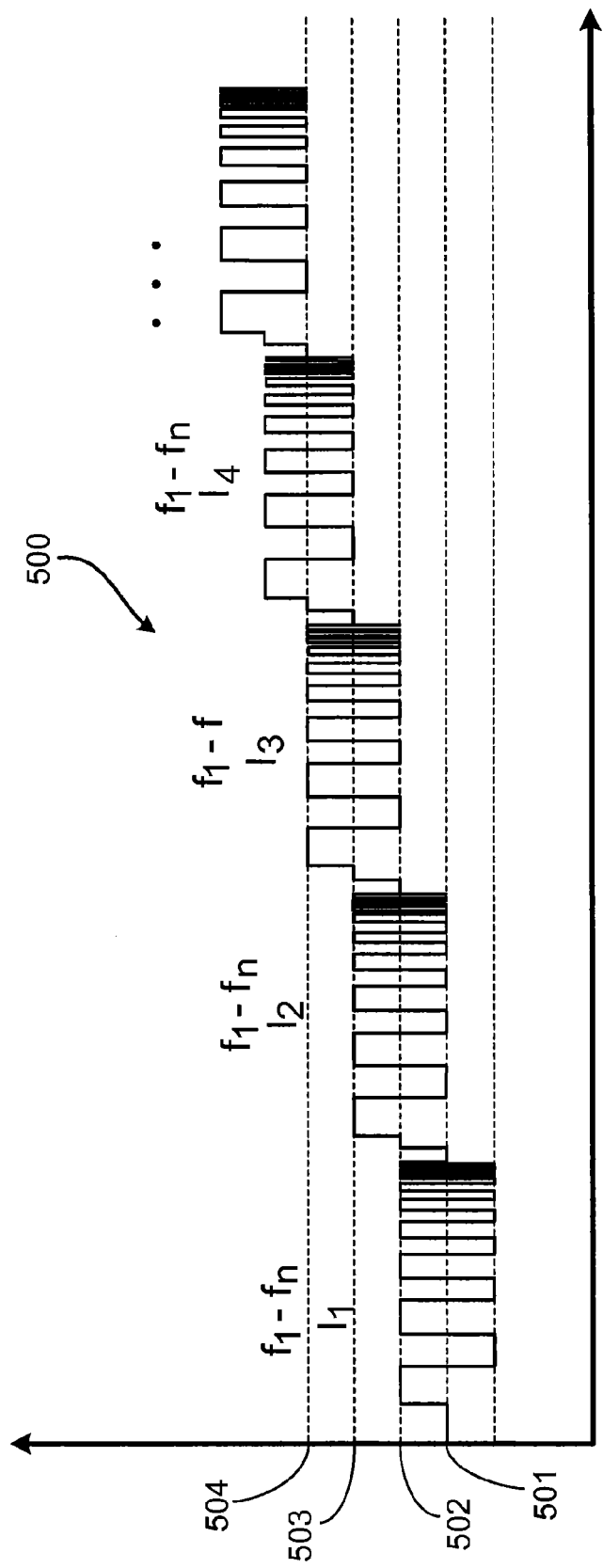

FIGS. 4A-4B, and 5A-5D illustrate an example of a four-stage charging profile generated by the control module 106 and charge/discharge module 102. During stages one and two, the control module 106 monitors the terminal voltage 405, 406 of the battery pack 200 using data received from the sensor module 104A, 104B to ensure the terminal voltage remains below a maximum voltage, $V_{max}$. In stage one, a direct current 401 is ramped from an initial current $I_{min}$ to a maximum current $I_{max}$ at a predetermined rate. The rate of increase is selected so as to allow sufficient time to apply an electrical stimulus to the battery pack 200. The electrical stimulus includes, for example, a pulsed current frequency sweep 500 at various predetermined current levels 501-504 as shown in FIG. 5A. The sensor module 104A, 104B provides the measured voltage and current information to the control module which are used to determine set points for the charging profile. For example, at each of the selected base current levels, $I_{n=1, 2, 3, etc}$., a pulsed current profile having a predetermined positive and negative pulse magnitude $I_{p+}$, $I_{p-}$ is superimposed upon $I_n$. The pulse frequency is swept from $f_{low}$ to $f_{high}$ while the sensor module continuously measures the voltage and current at the battery pack terminal and sends that information to the control module. The control module processes this information to calculate dV/dt at various pulse frequencies based on a predetermined frequency resolution. The measure of dV/dt provides an indicator of the battery pack charge acceptance and is inversely related such that the frequency or frequencies at which dV/dt is smallest (i.e., the "resonant charge frequencies") are the same frequencies at which charge acceptance is highest. FIG. 7A provides an example plot of dV/dt 700 versus frequency for a given current level, $I_{opt}$. As illustrated, dV/dt is smallest, and charge acceptance is highest, at frequencies 701-704 for a current $I_{opt}$. Temperature and/or pressure measurements may also be provided by the sensor module 104A, 104B to the control module 106 to modify the charging profile, e.g., by terminating the charging or discharging operation, increasing or decreasing V. or $I_{max}$, etc.

In some implementations, the control module 106 may calculate the dynamic internal impedance of the batteries at various pulse frequencies based on a predetermined frequency resolution. The dynamic internal impedance provides another indicator of the battery pack charge acceptance and is also inversely related such that the frequency or frequencies at which the dynamic internal impedance is smallest (i.e., the "resonant charge frequencies") are the same frequencies at which charge acceptance is highest. FIG. 7B provides an example plot of dynamic internal impedance 710 versus frequency for a given current level.

The control module 106 identifies the resonant charge frequency or frequencies 701-704, $f_{opt}$, at which dV/dt and/or the dynamic internal impedance are the smallest for each of the applied current levels 705-707. The control module 106 then uses this information to configure the charge/discharge module 102 to generate a charge profile corresponding to the optimal frequency or frequencies for the desired current level. The frequency sweep may also be repeated at each of the current levels until the difference between the identified optimal frequencies $f_{opt}'$ and the previously identified frequencies $f_{opt}$ are within a predetermined tolerance limit. In some implementations, the frequency sweep is repeated at the highest current level for which dV/dt may accurately be measured until the difference between the identified frequency $f_{opt}'$ and the previous frequency $f_{opt}$ is within a predetermined tolerance limit. In some implementations, $f_{opt}$ includes harmonics of the resonant charge frequencies.

Figure 6A:
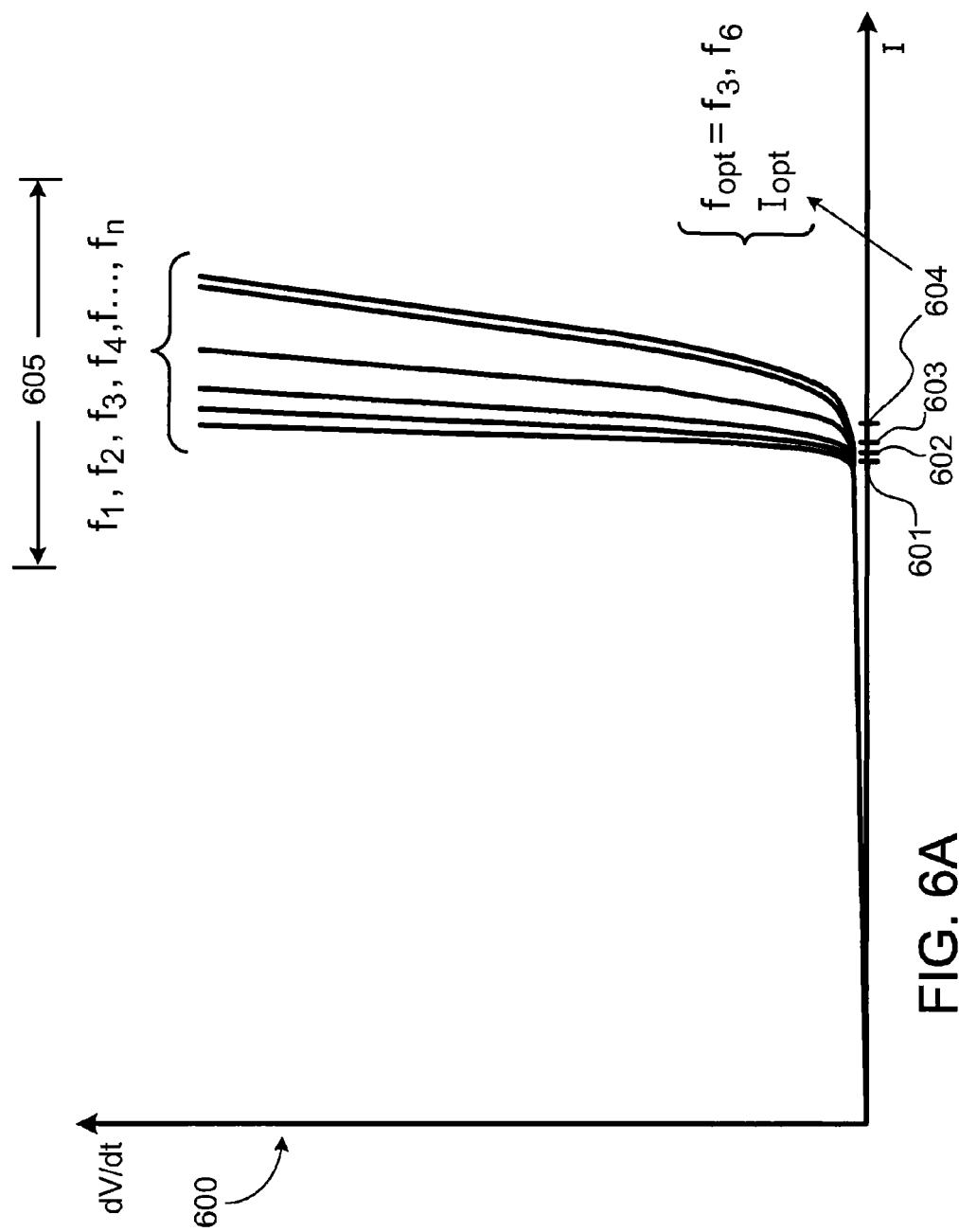
FIG. 6A is a graph plot showing dV/dt versus I at multiple pulse frequencies for batteries having an SOC of 0-20 percent.

FIG. 6A shows a graphical representation of dV/dt 600 versus 'I' at various frequencies 605, where 'I' includes the base current and pulse current amplitude (RMS). As shown, for each pulse frequency, there is a current magnitude 'I' 601-604 which results in an exponential increase in dV/dt. The initial current level and pulse frequency set points for stage two are determined based on this information. As shown, $f_{opt}$ indicates the optimum pulse frequency or frequencies for a desired current level $I_{opt}$ 604 which results in the largest delay prior to the sudden increase in dV/dt. As is also shown, $I_{opt}$ 604, indicates the maximum combined current level at which the battery pack can be charged while still avoiding the sharp increase in dV/dt.

Figure 8A:
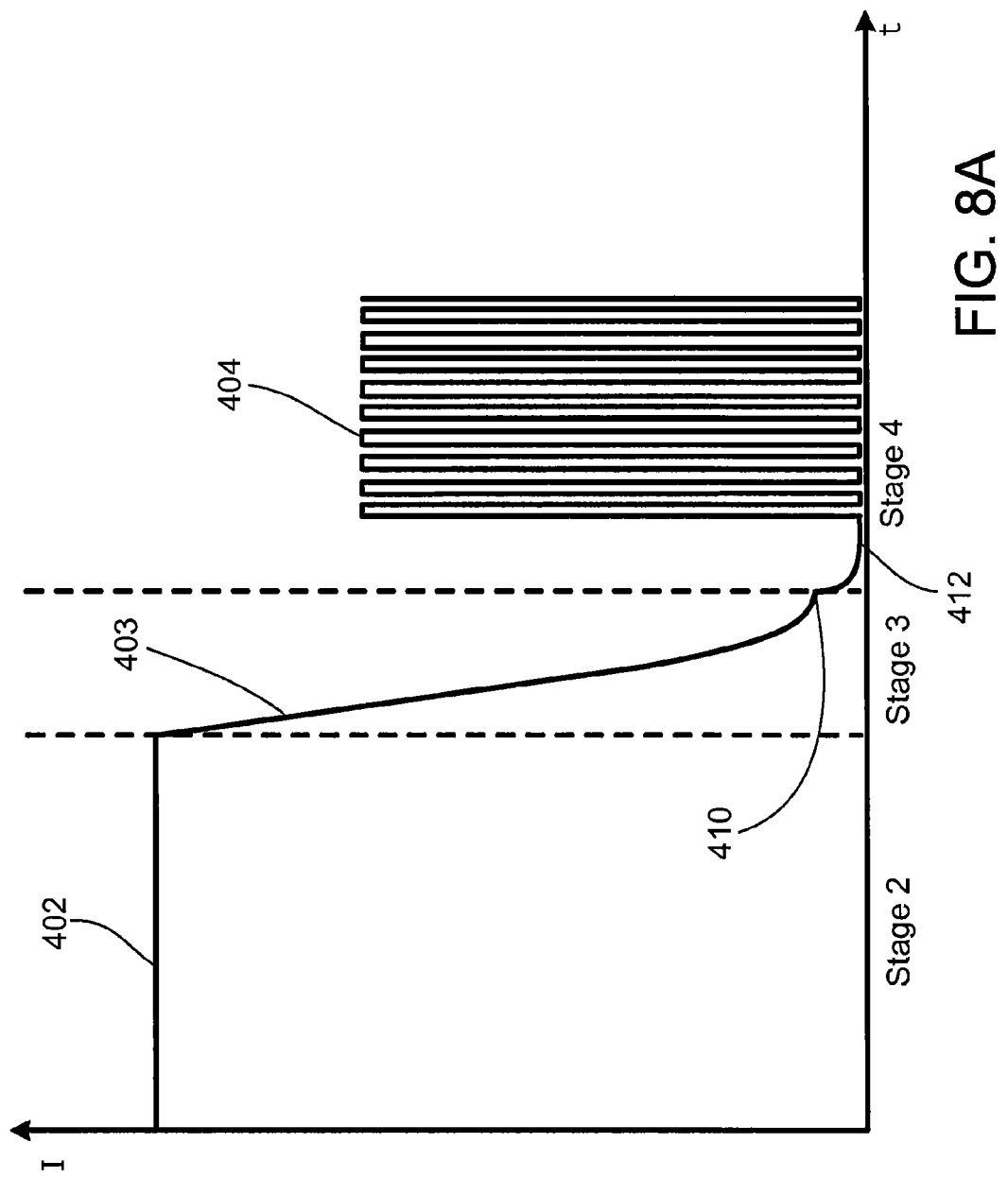

In some implementations, stage one may be omitted by using preset information determined from measurements taken during the manufacturing of the battery pack or during the initialization of the charge/discharge system. FIGS. 8A and 8C are examples of charging profiles omitting stage one. In some implementations, $f_{opt}$ may be obtained by subjecting the battery pack 200 to other types if electrical stimulus. For example, a transient signal (e.g., a single pulse) may be applied to the battery pack and a fast fourier transform may be performed on the measured response through the use of a spectrum analyzer, for example. In some implementations, $f_{opt}$ may be obtained by subjecting the battery pack 200 to a random signal having equal power spectral density within a fixed bandwidth at a predetermined center frequency, also known as white noise, and performing a fast fourier transform on the measured response. Each of these methods and those described above may be used to identify the frequencies, $f_{opt}$, for the various current levels and the corresponding SOC during a charging/discharging sequence, an initialization routine, and/or the manufacturing process.

Figure 5B:
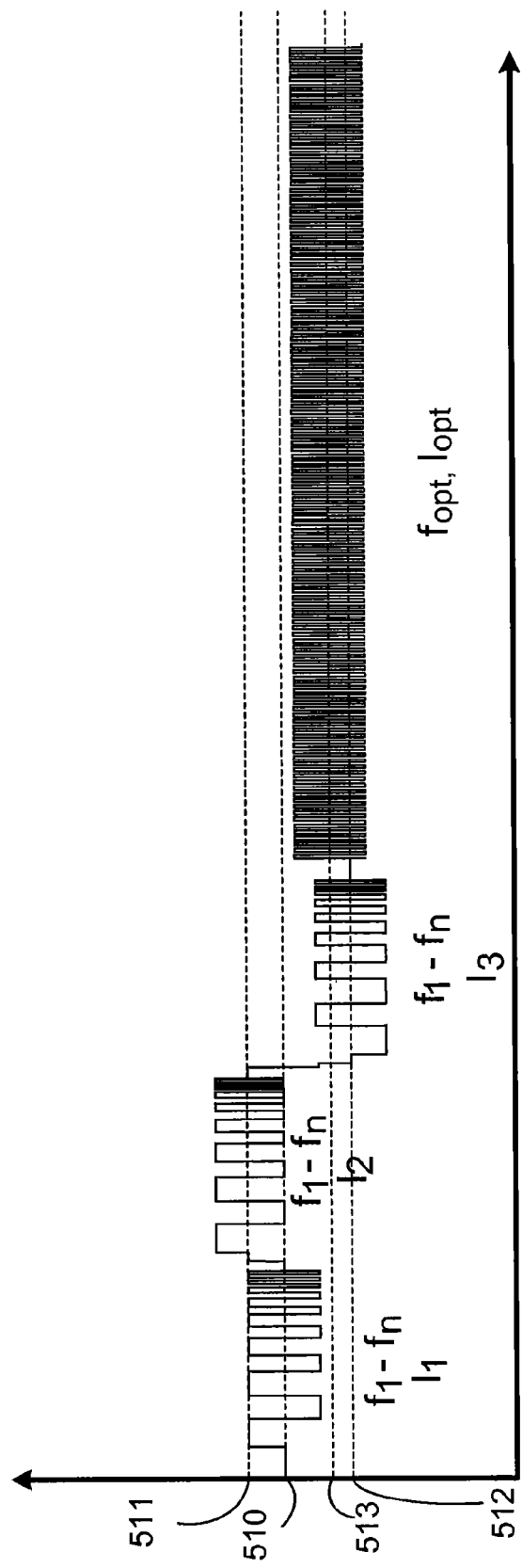

Referring again to FIGS. 4A-4B and 5A-5D, in stage two, the control module 106 configures the charge/discharge module 102 to generate a pulsed current profile having a total current magnitude equal to $I_{opt}$ and a pulse frequency equal to $f_{opt}$. Because the charge acceptance and internal impedance of the battery pack 200 changes as the state of charge changes, the frequency sweep is repeated at predetermined intervals for current levels within a predetermined range of the most recent $I_{opt}$. FIG. 5B provides an example of this retuning or search process in which a frequency sweep is conducted at various base currents 510-513 to identify $f_{opt}$ and $I_{opt}$. The range of the frequency sweep may be narrowed around the most recent $f_{opt}$ to increase frequency resolution and/or to reduce the sweep period. In some implementations, $f_{opt}$ may also be retuned in a variety of other ways, including preset information, and/or a fast fourier transform of the battery pack response after being subjected a stimulating signal as described above. Although FIG. 5B shows a charging profile consisting of a pulse waveform at a particular frequency, the charging profile may include a complex waveform representing multiple frequencies, $f_{opt}$.

Once $f_{opt}$ and $I_{opt}$ are retuned, the control module 106 configures the charge/discharge module 102 to the new set points. As shown in stage 2 of FIG. 4B, as the battery pack 200 is charged, the voltage 406 at the terminals of battery pack 200 will continue to increase until a target voltage is reached indicating the battery pack has reached a predetermined SOC. Preferably, the target voltage is set to correspond to an 80-85 percent SOC.

Once the predetermined SOC is reached, stage two is terminated and stage three is initiated. Stage two may alternatively be terminated after detecting an increase in the amount of power needed to source the charging current indicating the battery pack 200 is accepting charge at a much lower rate.

In stage three, the control module 106 configures the charge/discharge module 102 to clamp the voltage at the terminals of the battery pack 200 by switching from current-source mode to voltage-source mode and forcing a voltage $V_{set}$ 407 across the terminals of the battery pack. The current level 403 is allowed to drift as the battery pack 200 continues to absorb charge to the point of saturation. Upon reaching a steady state current 410, typically about 10 percent of the last $I_{opt}$, stage three is terminated and the voltage is ramped down to $V_{float}$ 408. In some implementations, the steady state current is at or near zero amps.

Figure 8B:
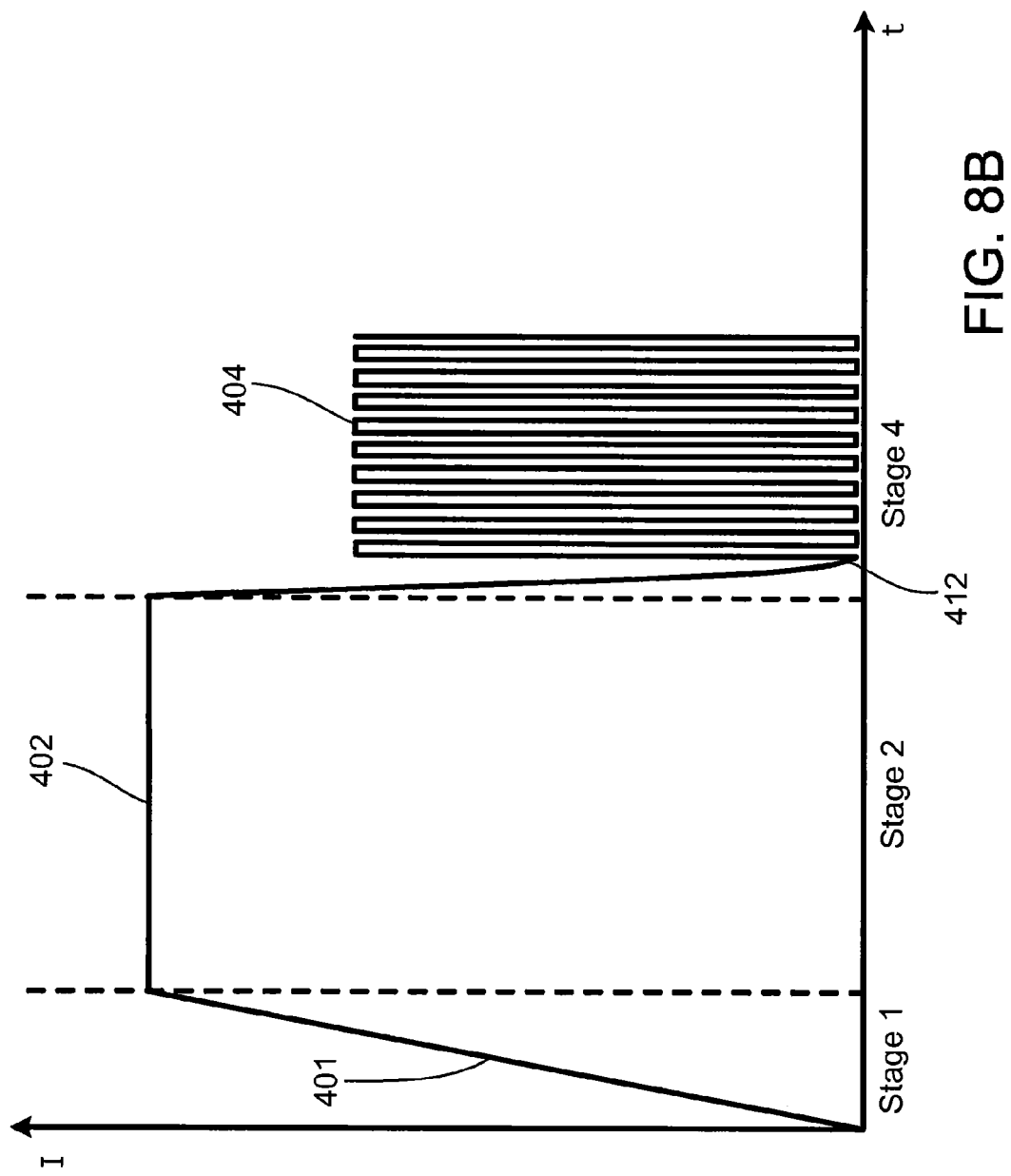

Alternatively, in stage three, the control module 106 may configure the charge/discharge module 102 to switch from current-source mode to voltage-source mode and to immediately ramp the battery terminal voltage from $V_{set}$ to $V_{float}$, omitting stage three and continuing on to stage four. FIGS. 8B and 8C illustrate charging profiles omitting stage 3.

Figure 5C:
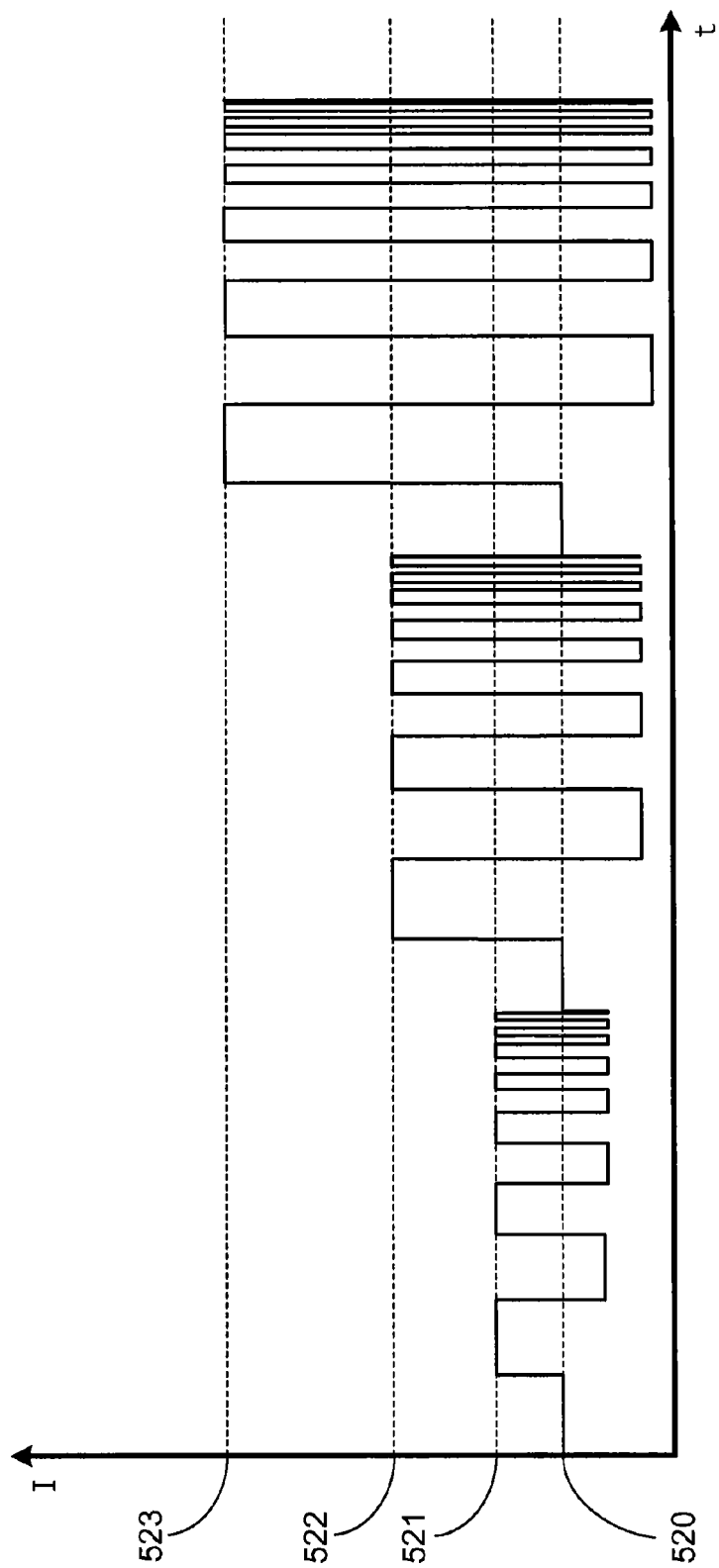

In stage four, the control module 106 configures the charge/discharge module 102 to current-source mode and to source a base current equal to the steady state current level 410 detected in stage three. In some implementations, the base current is set to a predetermined current level 412. After a brief resting period, a pulsed current profile having a predetermined positive and negative pulse magnitude $I_{p+}$, $I_{p-}$ is superimposed on the base current 412. The control module 106 then initiates a pulsed current frequency sweep at various intermediate pulse current levels as the pulse magnitudes are increased from $I_p$ to $I_{pmax}$. FIG. 5C is an example of a frequency sweep at various pulse magnitudes 521-523. The sensor module 104A, 104B once again provides the measured voltage and current information to the control module 106 which are used to determine set points for the next charging profile. For example, at each of the selected current levels, $I_{pn}$, a pulsed current profile having a positive and negative pulse magnitude $I_{pn+}$, $I_{pn-}$ is superimposed upon the base current 520, $I_{base}$. The pulse frequency is swept from $f_{low}$ to $f_{high}$ while the sensor module 104A, 104B continuously measures the voltage and current at the terminals of the battery pack 200 and sends that information to the control module 106. The control module 106 processes this information to calculate dV/dt at various pulse frequencies based on a predetermined frequency resolution. The control module 106 may also calculate the dynamic internal impedance of the battery pack 200 at various pulse frequencies based on a predetermined frequency resolution. The control module 106 then identifies the frequencies $f_{opt}$ at which dV/dt and/or the dynamic internal impedance are the smallest for each of the predetermined pulse magnitudes. The frequency sweep may also be repeated at each of the predetermined pulse magnitudes until the difference between the identified frequencies $f_{opt}'$ and the previous frequencies $f_{opt}$ is within a predetermined tolerance limit. In some implementations, the frequency sweep is repeated at the highest pulse magnitude for which dV/dt may accurately be measured until the difference between the identified frequencies $f_{opt}'$ and the previous frequencies $f_{opt}$ is within a predetermined tolerance limit.

Figure 5D:
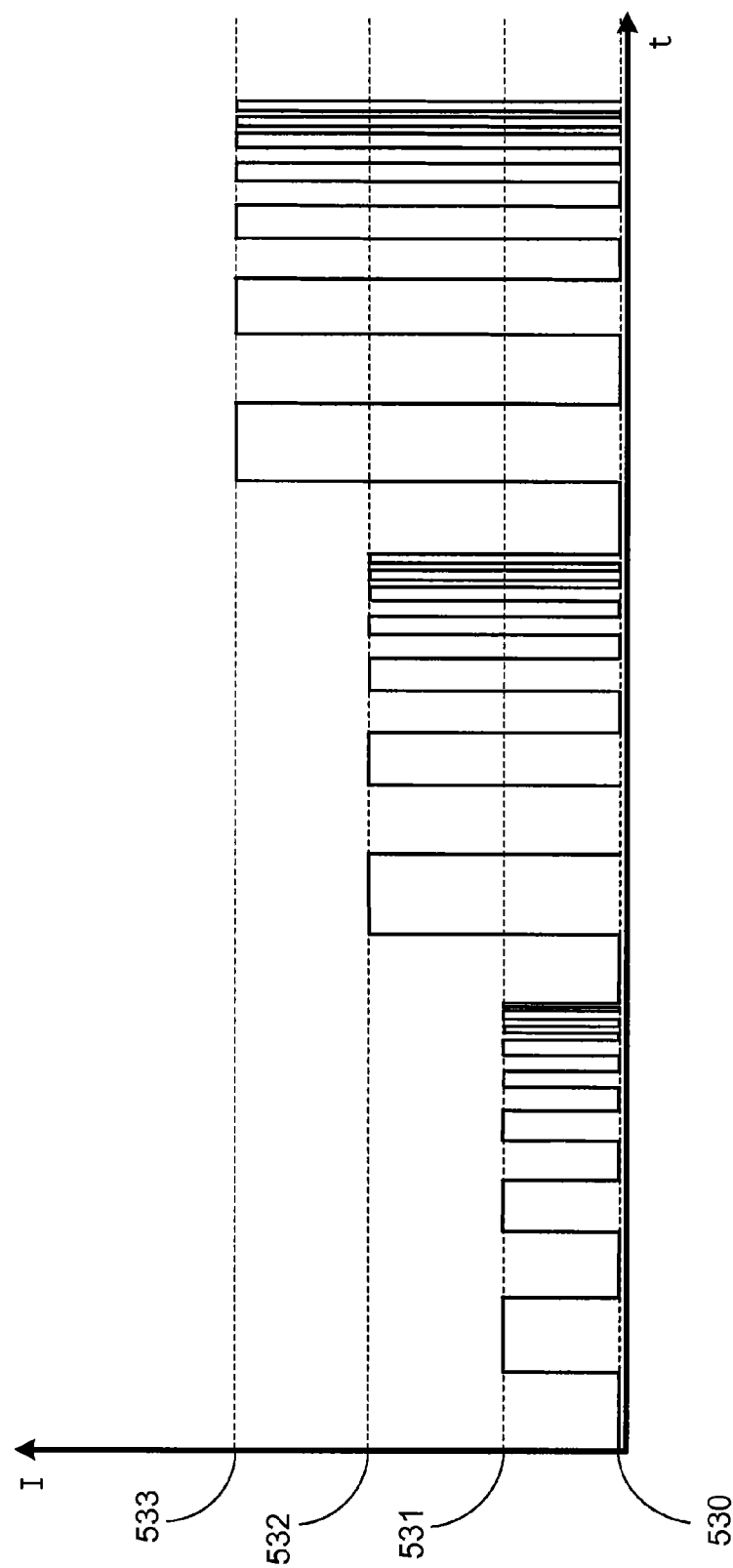

In some implementations, such as where stage three is omitted, a base current at or near zero amps may be used. After a brief resting period, a pulsed current profile having a predetermined positive pulse magnitude $I_{p+}$ is superimposed on the base current 412. The control module 106 then initiates a pulsed current frequency sweep at various intermediate pulse current levels as the pulse magnitude is increased from $I_p$ to $I_{pmax}$. FIG. 5D is an example of a frequency sweep at various pulse magnitudes 531-533 and a base current 530 at or near zero. The sensor module 104A, 104B once again provides the measured voltage and current information to the control module 106 which are used to determine set points for the next charging profile. For example, at each of the selected current levels, $I_{pn}$, a pulsed current profile having a positive pulse magnitude $I_{pn+}$ is superimposed upon the base current, $I_{base}$. The pulse frequency is swept from $f_{low}$ to $f_{high}$ while the sensor module 104A, 104B continuously measures the voltage and current at the terminals of the battery pack 200 and sends that information to the control module 106. The control module 106 processes this information to calculate dV/dt at various pulse frequencies based on a predetermined frequency resolution. The control module 106 may also calculate the dynamic internal impedance of the battery pack 200 at various pulse frequencies based on a predetermined frequency resolution. The control module 106 then identifies the frequencies $f_{opt}$ at which dV/dt and/or the dynamic internal impedance are the smallest for each of the predetermined current levels. The frequency sweep may also be repeated at each of the predetermined current levels until the difference between the identified frequency $f_n'$ and the previous frequency $f_n$ is within a predetermined tolerance limit.

FIG. 6B shows a graphical representation of dV/dt versus 'I' at various frequencies 615, where 'I' includes the base current and pulse current amplitude (RMS). As described previously, for each pulse frequency, there is a current level 'I' which results in an exponential increase in dV/dt. However, as shown, the onset of this exponential increase occurs at a much lower current level 611, 612 due to the increased SOC. The initial current level and pulse frequency set points for stage four are determined based on this information. Once again, $f_{opt}$ indicates the optimum pulse frequencies which generate the largest delay prior to the sudden increase in dV/dt, and $I_{opt}$ 612 indicates the maximum combined current level at which the battery pack can be charged while still avoiding the sharp increase in dV/dt. As described above, $f_{opt}$ may also be determined in a variety of other ways, including preset information, and a fast fourier transform of the battery pack response after being subjected a stimulating signal. Each of these methods and those described above may be used to identify the frequencies, $f_{opt}$, for the various pulse magnitudes and the corresponding SOC during a charging/discharging sequence, an initialization routine, and/or the manufacturing process.

Referring once again to FIGS. 4A-4B and 5A-5D, in stage four, the control module 106 configures the charge/discharge module 102 to generate a current profile 404 having a total current magnitude equal to $I_{opt}$ and a pulse frequency equal to $f_{opt}$. As the SOC increases, the set points may be retuned similar to stage two. However, unlike stage two, the base current in stage four remains fixed and the pulse magnitude, $I_{pn}$, is changed resulting in a total current magnitude equal to $I_{opt}$. As before, the frequency sweep is repeated at predetermined intervals for pulse current magnitudes within a predetermined range of the current $I_{pn}$. In some implementations, the range of the frequency sweep is narrowed around the most recent $f_{opt}$ to increase frequency resolution and/or to reduce the sweep period. Once the new $f_{opt}$ and $I_{opt}$ set points are determined, the control module 106 configures the charge/ discharge module 102 to the new set points. As described above, $f_{opt}$ may also be retuned in a variety of other ways, including preset information, and a fast fourier transform of the battery pack response after being subjected a stimulating signal. In some implementations, this sequence is continued until the battery pack 200 is fully charged.

In discharge mode, the charge/discharge module 102 functions as a variable current sink drawing current from the battery pack 200, i.e. by reversing the direction of the current flow. Similar to the charging mode, a load current is ramped from an initial current $I_{min}$ to a maximum current $I_{max}$ at a predetermined rate. The rate of increase is selected so as to allow sufficient time to apply an electrical stimulus to the battery pack, e.g. a pulsed load current frequency sweep at various predetermined load current levels. The sensor module 104A, 104B provides the measured voltage and current information to the control module 106 which is used to determine set points for the discharge profile. For example, similar to the sequence shown in FIG. 5A, at each of the selected load current levels 501-504, $I_L$, a pulsed load current profile having a predetermined positive and negative pulse magnitude $I_{p+}$, $I_{p-}$ is superimposed upon the base load current, $I_L$. The pulse frequency is generated by drawing current from the battery pack 200 in bursts of varying length with respect to time. The pulse frequency is increased from $f_{low}$ to $f_{high}$ while the sensor module 104A, 104B continuously measures the voltage and current at the terminals of the battery pack 200 and sends that information to the control module 106. The control module 106 processes this information to calculate dV/dt at various pulse frequencies based on a predetermined frequency resolution. The measure of dV/dt provides an indicator of the battery pack discharge performance by identifying the frequencies for the desired load current at which the terminal voltage is least affected (i.e., the "resonant discharge frequency"). The control module 106 may use this information to determine the optimal frequency or frequencies at which to draw the power from the battery pack 200. Temperature and/or pressure measurements may also be provided by the sensor module 104A, 104B to the control module 106 to modify the discharging profile, e.g., terminating the discharging operation, increasing or decreasing the load current magnitude, etc.

In some implementations, stage one may be omitted by using preset information determined from measurements taken during the manufacturing of the battery pack 200, during the initialization of the charge/discharge system 100, or during a previous charge/discharge cycle. In some implementations, $f_{opt}$ may be obtained by subjecting the battery pack 200 to a transient signal such as a single pulse and performing a fast fourier transform on the measured response using a spectrum analyzer or frequency detection circuitry, for example. In some implementations, $f_{opt}$ may be obtained by subjecting the battery pack 200 to white noise, and performing a fast fourier transform on the measured response.

In some implementations, the control module 106 may calculate the dynamic internal impedance of the battery pack 200 at various pulse frequencies based on a predetermined frequency resolution. The dynamic internal impedance provides another indicator of the battery pack discharge performance. Using this information, the control module identifies the frequency $f_{opt}$ at which dV/dt and/or the dynamic internal impedance are the smallest for each of the predetermined current levels, and thus, the frequency at which discharge performance is optimal, i.e. least amount of decrease in battery pack terminal voltage at the desired load current. In some implementations, the frequency sweep may be repeated at each of the predetermined load current levels until the difference between the identified frequency $f_{opt}'$ and the previous frequency $f_{opt}$ is within a predetermined tolerance limit. In some implementations, the frequency sweep is repeated at the highest load current level for which dV/dt may accurately be measured until the difference between the identified frequency $f_{opt}'$ and the previous frequency $f_{opt}$ is within a predetermined tolerance limit.

In stage two of the discharge mode, the control module 106 configures the charge/discharge module 102 to generate a pulsed load current profile having a total current magnitude equal to $I_{opt}$, including the base load current and the pulse current amplitude (RMS), and the optimal pulse frequency or frequencies, $f_{opt}$. Because the discharge characteristics and the internal impedance of the battery pack 200 change as the state of charge changes, the frequency sweep may be repeated at predetermined intervals for load current levels within a predetermined range centered on the most recent $I_{opt}$, similar to the sequence shown in FIG. 5B. The range of the frequency sweep may be narrowed around the most recent $f_{opt}$ to increase frequency resolution and/or to reduce the sweep period. Once the new $f_{opt}$ and $I_{opt}$ set points are determined, the control module 106 configures the charge/discharge module 102 to the new set points. As described above, $f_{opt}$ may also be retuned in a variety of other ways, including preset information, and a fast fourier transform of the battery pack response after being subjected a stimulating signal. In some implementations, a retune sequence is repeated at predetermined intervals or at predetermined SOC's.

As the battery pack 200 is discharged, the voltage at the battery pack terminal will continue to decrease until a predetermined minimum voltage is reached, indicating the battery pack has reached a predetermined SOC. In some implementations, the minimum voltage set point corresponds to a 15-20 percent SOC.

Once the predetermined SOC is reached, stage two is terminated and stage three of the discharge mode is initiated. In stage three, the charge/discharge module 102 is configured to draw little or no base current. After a brief resting period, a pulsed load current profile having a predetermined positive pulse magnitude $I_{p+}$ is superimposed on the base current. The control module 106 then initiates a frequency sweep as the pulse magnitude is increased from $1_p$ to $I_{pmax}$, similar to the sequence shown in FIG. 5D. The sensor module 104A, 104B once again provides the measured voltage and current information to the control module 106 which are used to determine set points for the next discharge profile. For example, at each of the selected load current levels, $I_L$, a pulsed load current profile having a positive pulse magnitude $I_{pn+}$ is superimposed upon the base load current, $I_{base}$. The pulse frequency is swept from $f_{low}$ to $f_{high}$ while the sensor module 104A, 104B continuously measures the voltage and current at the battery pack terminal and sends that information to the control module 106. The control module 106 processes this information to calculate dV/dt at various pulse frequencies based on a predetermined frequency resolution. The control module 106 may also calculate the dynamic internal impedance of the battery pack 200 at various pulse frequencies based on a predetermined frequency resolution. The control module 106 then identifies the frequency or frequencies at which dV/dt and/or the dynamic internal impedance are the smallest for each of the predetermined load current levels. In some implementations, the frequency sweep is repeated at each of the predetermined load current levels until the difference between the identified frequencies $f_{opt}'$ and the previous frequencies $f_{opt}$ are within a predetermined tolerance limit. In some implementations, the frequency sweep is repeated within a subset of the predetermined load current levels until the difference between the identified frequencies $f_{opt}'$ and the previous frequencies $f_{opt}$ are within a predetermined tolerance limit. Using this information, the control module 106 configures the charge/discharge module 102 to generate a load current profile having a total load current magnitude equal to $I_{opt}$ and a pulse frequency or frequencies, $f_{opt}$. This sequence is continued until the battery pack 200 is fully discharged, a minimum SOC limit is reached, or a charge cycle is initiated.

Although a number of implementations of the charge/discharge system 100 are described, other implementations may also be used. In some preferred examples, the battery packs and circuits discussed in detail in U.S. Patent App. No. filed on Oct. 12, 2006, entitled "POWER SUPPLY MODULES HAVING A UNIFORM DC ENVIRONMENT" by Aeron Hurst, et al., application Ser. No. 11/549,006, which is herby incorporated by reference in its entirety, can also be used to construct charge/discharge systems 100.

A number of examples of the invention have been described. Nevertheless, it will be understood that various modifications may be made, and variations on the disclosed examples may be provided, without departing from the spirit and scope of the invention. For example, sinusoidal, sawtooth, and triangular waveforms, as well as other types of waveforms, may be used in place of, or in addition to, the square pulse waveforms illustrated above. As another example, different circuitry may be used to practice the methods described herein. Accordingly, the following claims define the scope of the invention.

What is claimed is:

1. A battery power transfer system, comprising:
control circuitry coupled to a charge/discharge module, the charge/discharge module being configured to apply an electrical stimulus to a battery and to determine, based at least in part on a measured response of the battery to the applied electrical stimulus, a target power transfer frequency of the battery;
wherein power is transferred to or from the battery with a power transfer profile comprising current pulses having a frequency component selected based on the determined target power transfer frequency.

2. The system of claim 1, wherein the measured response of the battery is selected from the group consisting of: a rate of change in voltage, a dynamic internal impedance, and a frequency response.

3. The system of claim 1, further comprising measurement circuitry coupled to the control circuitry to provide the measured response of the battery.

4. The system of claim 3, wherein the measurement circuitry comprises an optically-isolated voltage detector.

5. The system of claim 3, wherein the measurement circuitry comprises a spectrum analyzer.

6. The system of claim 3, wherein the measurement circuitry comprises a sensor module configured to measure at least one of a temperature and a pressure of the battery, wherein at least one of the measured temperature and pressure are used to modify the power transfer profile.

7. The system of claim 1, wherein the electrical stimulus is a discharge pulse signal having a pulse frequency, and the charge/discharge module is configured to sweep the pulse frequency over a frequency sweep range from an initial pulse frequency to a maximum pulse frequency.

8. The system of claim 7, wherein the charge/discharge module is configured to repeatedly sweep the pulse frequency at a given current level.

9. The system of claim 1, wherein the charge/discharge module is a bidirectional power supply.

10. The system of claim 1, wherein the power transfer profile further comprises a base current having a base current magnitude, and wherein the current pulses are superimposed on the base current.

11. The system of claim 1, wherein the base current magnitude is variable, and wherein the control circuitry is configured to adjust the base current magnitude based on the measured response.

12. The system of claim 1, wherein the battery is one of a plurality of interconnected batteries of a battery pack of the system.

13. The system of claim 12, wherein the current pulses comprise different frequency components selected based on determined target power transfer frequencies of different batteries of the pack.

14. The system of claim 1, wherein the frequency component selected based on the determined target power transfer frequency is the determined target power transfer frequency, or a harmonic thereof.

15. The system of claim 1, wherein the determined target power transfer frequency is configured to be retuned when a state of charge of the battery changes.

16. The system of claim 15, wherein the determined target power transfer frequency is configured to be retuned by at least one of a repeated frequency sweep at predetermined intervals, preset information, and a fast fourier transform of a response from the battery after being subjected to an applied electrical stimulus.

17. A battery power transfer system, comprising:
control circuitry coupled to a charge/discharge module, the charge/discharge module being configured to apply an electrical stimulus to a battery and to determine a target power transfer frequency of the battery;
wherein power is transferred to or from the battery with a power transfer profile comprising current pulses having a frequency component selected based on the determined target power transfer frequency.

18. The system of claim 17, wherein the target power transfer frequency is determined, based at least in part, on a measured response of the battery to the applied electrical stimulus, and wherein the measured response is selected from the group consisting of: a rate of change in voltage, a dynamic internal impedance, and a frequency response.

19. The system of claim 17, further comprising measurement circuitry coupled to the control circuitry to provide a measured response of the battery.

20. The system of claim 19, wherein the measurement circuitry comprises an optically-isolated voltage detector.

21. The system of claim 19, wherein the measurement circuitry comprises a spectrum analyzer.

22. The system of claim 18, wherein the electrical stimulus is a discharge pulse signal having a pulse frequency, and the charge/discharge module is configured to sweep the pulse frequency over a frequency sweep range from an initial pulse frequency to a maximum pulse frequency.

23. The system of claim 17, wherein the charge/discharge module is a bidirectional power supply.

24. The system of claim 17, wherein the power transfer profile further comprises a base current having a base current magnitude, and wherein the current pulses are superimposed on the base current.

25. The system of claim 17, wherein the base current magnitude is variable, and wherein the control circuitry is configured to adjust the base current magnitude based on the measured response.

26. The system of claim 17, wherein the battery is one of a plurality of interconnected batteries of a battery pack of the system.

27. A method of charging a battery, the method comprising:
   applying an electrical stimulus to the battery using a charge/discharge module;
   measuring a response of the battery to the electrical stimulus using the charge/discharge module;
   determining a target power transfer frequency based at least in part on the response of the battery to the applied electrical stimulus; and
   charging the battery with a charge current profile comprising current pulses having a frequency component selected based on the determined target power transfer frequency.

28. The method of claim 27, wherein the electrical stimulus is selected from the group consisting of: a transient signal, a flat power spectral density within a fixed bandwidth at a predetermined center frequency, and a charge pulse signal having a charge pulse frequency.

29. The method of claim 27, wherein the electrical stimulus is a charge pulse signal having a charge pulse frequency, and applying the electrical stimulus to the battery includes sweeping the charge pulse frequency over a frequency sweep range from an initial pulse frequency to a maximum pulse frequency.

30. The method of claim 27, wherein the measured response of the battery is selected from the group consisting of: a rate of change in voltage, a dynamic internal impedance, and a frequency response.

\* \* \* \* \*